(12) United States Patent
Finney

(10) Patent No.: US 6,249,023 B1
(45) Date of Patent: Jun. 19, 2001

(54) GATED SEMICONDUCTOR DEVICE

(75) Inventor: Adrian David Finney, Oldham (GB)

(73) Assignee: Zetex PLC (GB)

( * ) Notice: Subject to any disclaimer, the term of this patent is extended or adjusted under 35 U.S.C. 154(b) by 0 days.

(21) Appl. No.: 09/376,146

(22) Filed: Aug. 17, 1999

(30) Foreign Application Priority Data

Aug. 21, 1998 (GB) .................................................. 9818182

(51) Int. Cl.[7] .............................. H01L 29/76; H01L 29/58
(52) U.S. Cl. .......................... 257/328; 257/337; 257/339; 257/341; 257/491; 438/212; 438/268
(58) Field of Search .................................. 257/328, 337, 257/339, 341, 487–496; 438/212, 268

(56) References Cited

U.S. PATENT DOCUMENTS

| | | | |
|---|---|---|---|
| 4,567,502 | * | 1/1986 | Nakagawa et al. ..................... 357/53 |
| 5,430,316 | * | 7/1995 | Contiero et al. ...................... 257/335 |
| 5,557,127 | * | 9/1996 | Ajit et al. ................................ 257/33 |
| 5,959,345 | * | 9/1999 | Fruth et al. ........................... 257/605 |
| 5,973,359 | * | 10/1999 | Kobayashi et al. ................... 257/328 |

* cited by examiner

Primary Examiner—Tom Thomas
Assistant Examiner—Donghee Kang

(57) ABSTRACT

A gated semiconductor device comprising a substrate defining an active surface area including source regions, and a series of gates formed adjacent and insulated from the source regions. A source electrode contacts the source regions. A termination extends around the periphery of the active surface area, The termination comprises a gate electrode and a layer of conductive material electrically connected between the gate electrode and the gates. The layer of conductive material extends to the source electrode and incorporates a series of regions which are alternately N and P type so as to define a series of breakdown diode junctions distributed around the active surface area and interposed between tie gate electrode and source electrode, In normal operation gate current flows through portions of the conductive layer which do not incorporate diode junctions. In the event that the gate/source voltage exceeds a predetermined level, the diode junctions break down, shorting the gate to the source.

8 Claims, 3 Drawing Sheets

GATED SEMICONDUCTOR DEVICE

BACKGROUND OF THE INVENTION

The present invention relates to a gated semiconductor device having a field plate termination.

For MOS gated semiconductor devices such as field effect transistors, the standard method of termination is to continue source metal beyond the periphery of an active area of the device so as to form a field plate extending around the periphery of the device In an N-channel MOSFET, when a positive bias is applied to the drain whilst the gate and source are connected to the ground potential the transistor is in the forward-biased off state. This creates a depletion region which is brought to tie surface more gradually at the edge of the device than at the centre due to the presence of the field plate formed from the continuation of the source metal. This reduces the peak electric field at the periphery of the device, thus increasing the breakdown voltage.

One requirement of a MOSFET device is to connect the gate to a gate bond pad. The gate is normal made of polysilicon which has a significant resistance that combines with the device capacitance to create a time constant RC. In order to give acceptable switching characteristics it is thus necessary to break the source metal by distributing metal gate electrodes throughout the structure and/or around the periphery of the device. Some MOSFETs use a striped rather than a matrix polysilicon design, in which case the gate electrode may also be needed to connect the polysilicon gate stripes together. The larger the gate electrode area, the faster the switching, but also the higher the on resistance, and so there needs to be a trade-off between speed and resistance.

It is known to combine the functions of a field plate and a gate electrode by forming a conductive layer separated from the substrate by an insulating layer and extending around the active surface area between the field plate and gates which are positioned around the periphery of the active area. In this type of arrangement, the conductive layer and the peripheral gates may be formed from portions nf a single layer of polysilicon on which a field plate conductor is deposited.

These known devices in which the field plate and peripheral gates are interconnected can be damaged or destroyed however by electrostatic discharge or circuit transients. An electrostatic discharge (e.g. from a human being) can charge up the gate to a potential beyond its rupture voltage, thus destroying or irreparably damaging the insulating layer which separates the gate from the substrate.

BRIEF DESCRIPTION OF THE INVENTION

It is an object of the present invention to provide a gated semiconductor device which obviates or mitigates the above disadvantage.

According to the present invention, there is provided a gated semiconductor device comprising a substrate defining an active surface area including at least one source region, at least one gate formed adjacent to and insulated from the at least one source region, a source electrode in electrical contact with the source region, and a termination extending around the periphery of the active surface area, the termination comprising a gate electrode and a layer of conductive material electrically connected between the gate electrode and the said at least one gate, wherein the layer of conductive material is in electrical contact with the source electrode and incorporates at least one N-P junction defining a semiconductor breakdown diode located so as to be connected in series between tie gate electrode and tie source electrode.

Preferably, spaced apart portions of an outer edge of the source electrode electrically contact the conductive layer, openings are formed in the conductive layer spaced apart around the outer edge of the source electrode such that each said spaced apart portion of the source electrode edge is located between the openings of a respective pair of openings, and N-P junctions are formed in the conductive layer outside the outer edge of the source electrode such that each junction extends between and terminates at die openings of a respective one of the said pairs of openings.

The layer of conductive material and each gate to which the conductive material is connected may be formed from a single layer of polysilicon. The polysilicon layer may support a metal gate electrode. The polysilicon layer is preferably connected to a plurality of gates distributed adjacent the periphery of the active surface area of the substrate. Preferably a plurality of diodes are arranged in series between the gate electrode and the source electrode, the diodes being formed from successive sections of N and P type conductive materials.

An embodiment of the present invention will now be described by way of example with reference to the accompanying drawings, in which:

DETAILED DESCRIPTION OF EMBODIMENTS OF THE INVENTION

Figure 1:
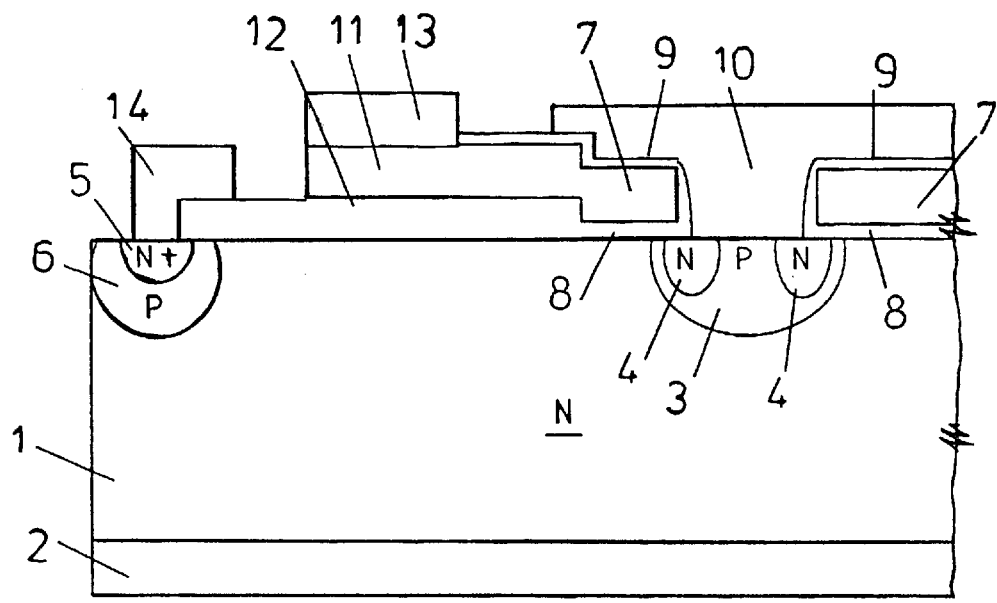
FIG. 1 is a schematic representation of one edge of a conventional gated semiconductor device.

Referring to FIG. 1, there is illustrated a prior art gated semiconductor device, in this instance an N-channel MOSFET, comprising a substrate 1 on which is formed a drain 2. Diffused into the substrate 1 are areas of differing conductivity forming body regions 3, source regions 4, and a channel stop region formed by floating N region 5 within P region 6 which extends around the periphery of the substrate, and thus around an active device area in which the regions 3 and 4 are formed. Alternatively, the channel stop region may be formed from just an N region 5, or may be omitted altogether. Polysilicon gate electrodes 7 are provided on layers of insulator 8 defined by an oxide layer and are covered by further layers of insulator 9. A metal source layer 10 contacts regions 3 and 4 and extends over part of the peripheral insulator layer 9.

A polysilicon layer 11 extends radially outwards from the gate 7 which is adjacent the edge of the device. The polysilicon layer 11 is formed on an oxide layer 12 which may be thicker than the oxide layer 8 beneath the gate 7 so as to improve the breakdown voltage in sonie embodiments (e.g. higher voltage variants) although this is not essential. A conductive gate electrode 13 is formed on the polysilicon layer 11, and a conductive equipotenitial ring 14 contacts the optional channel stop region 5, 6.

In use, when a positive bias is applied to drain 2 whilst the gates 7 and source 10 are connected to ground potential, the transistor is in the forward biased off state. The forward potential is supported across the P-body 3 and N-drain region 1. This creates a depletion region which is brought to the surface more gradually at the edge of the device by the polysilicon layer 11. This reduces the peak electric field at the periphery of the device, increasing the breakdown voltage.

As the polysilicon layer 11 is connected to the gate electrode 13 a very effective structure is formed which distributes gate current around the periphery of the active area. The combination of the gate electrode 13 and polysilicon layer 11 can still function as a field plate because during the forward biased on state both the gates 7 and source 10 are at ground potential. Gate electrode 13 could also be combined with conventional gate electrodes (not shown) feeding central regions of the device and is connected remotely to a gate bond pad (not shown in FIG. 1).

Figure 2:
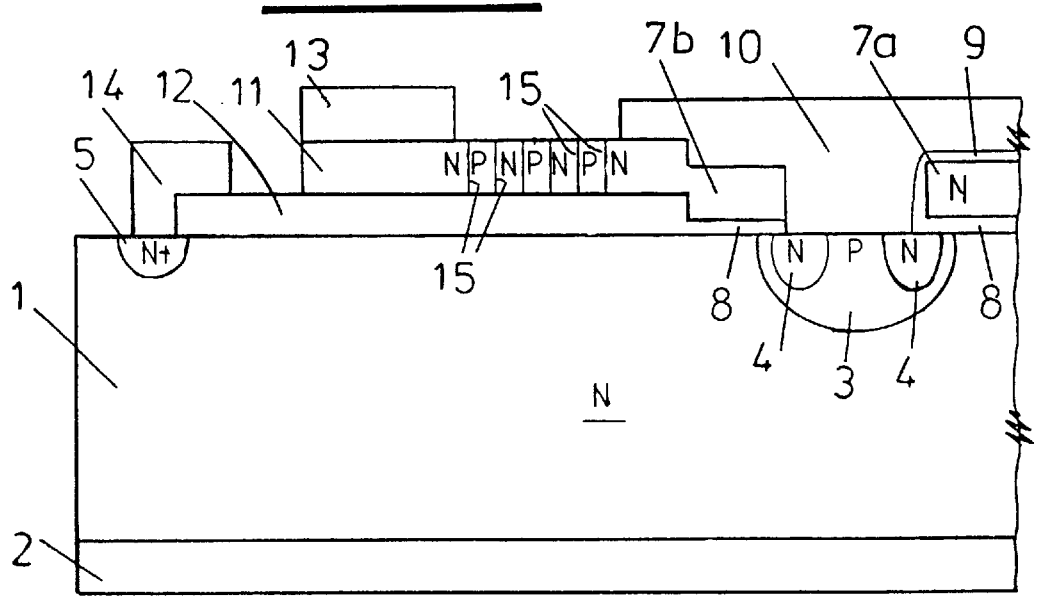
FIG. 2 is a schematic representation of one edge of a gated semiconductor device in accordance with the present invention.

Referring to FIG. 2, there is illustrated a device according to the present invention. The same reference numerals are used where appropriate as are used in FIG. 1. The device comprises a drain 2, body region 3, source regions 4 and optional channel stop region 5. Gate 7a is insulated from the substrate 1 by insulator 8. Region 7b, which corresponds in position to the peripheral gate 7 of the arrangement of FIG. 1, is shorted to the source electrode 10 and therefore does not function as a gate in the arrangement of FIG. 2. A gate electrode 13 is provided on the polysilicon layer 11 which is located on oxide insulating layer 12. An equipotenitial ring 14 is provided around the periphery of the device.

A gate-source zener diode suitable for electrostatic discharge (ESD) protection, circuit transient protection etc is provided in the polysilicon layer by introducing dopants so as to define alternate N and P regions between which junctions 15 are formed in the polysilicon layer 11. The junctions 15 form a series of alternately forward and reverse biased zener diodes between the source electrode 10 and the gate electrode 13. Each diode typically has a low breakdown voltage (Vz), e.g. 5V but in combination a larger overall Vz can be achieved as the individual diode breakdown voltages in effect are summed together. Combinations of diodes have the further advantage that the overall Vz can be made the same in both directions.

Figure 3:
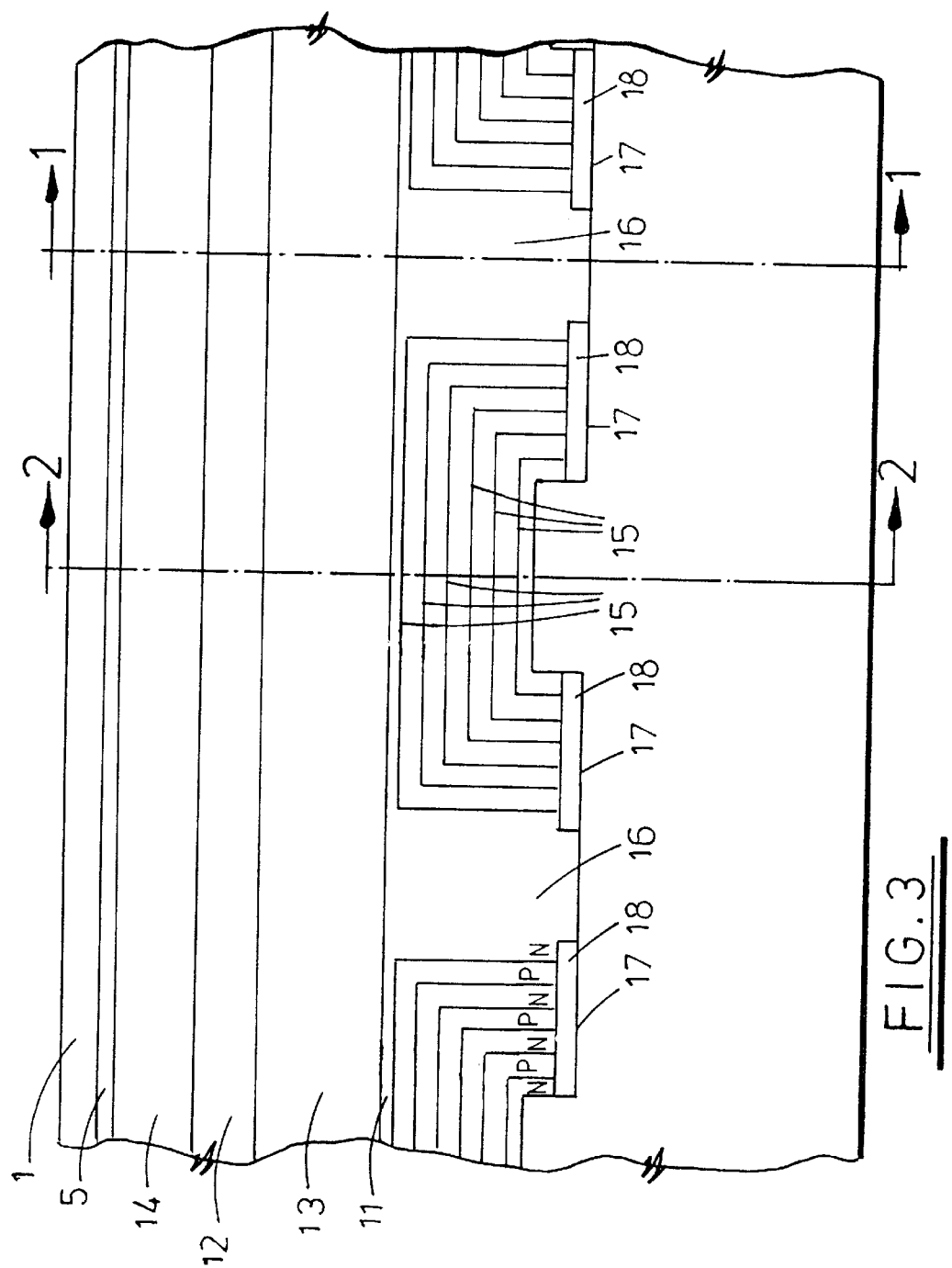
FIG. 3 is a plan view of the device edge shown in FIG. 2.

FIG. 3 is a plan view of FIG. 2, the position of the section represented by FIG. 2 being indicated in FIG. 3 by line 2—2. It will be seen that the N and P doped regions are C-shaped such that regions 16 of the polysilicon layer 11 are defined between regions of the polysilicon layer 11 occupied by the junctions 15. The regions 16 extend beneath but are insulated from the source metal layer 10 and provide a gate current path to peripheral gates (not shown) which Underlie and are insulated from the source electrode 10. The ends of tile C-shaped N and P doped regions are spaced from the peripheral regions 7b (FIG. 2) which underlie the source metal 10 (the edge of which is indicated by lines 17) by openings 18 formed in the polysilicon layer 11. Thus spaced apart portions of the outer edge of the source electrode electrically contact the conductive layer 11 between respective pairs of the openings 18 but those spaced apart portions are located on tie opposite side of the junctions 15 from the gate electrode 13. Accordingly current can flow directly between the gate and source electrodes only if the diode junctions break down. Gate current in contrast flows beneath the source electrode 10 through the regions 16 which are located between the regions of the conductive layer 11 in which the junctions 15 are formed.

In the illustrated example, the peripheral gates and the gate current path regions 16 are N doped. However, the peripheral gates and the gate current path regions may be P doped. Similarly, the polysilicon which contacts the source metal is shown N doped but could be P doped. The various possible combinations may require different numbers of junctions 15 to achieve required diode characteristics.

In FIG. 3, a section on the line 1—1 would reveal a structure similar to the conventional structure illustrated in FIG. 1, the only difference being the optional addition of the P-region 6. It will of course be appreciated that alternative layouts to that illustrated in FIGS. 2 and 3 are possible in order to establish breakdown diodes connected in series between the gate and source electrodes.

Preferably the N and P rings which define the junctions 15 are formed by using a body implant to dope the polysilicon such that it becomes P type at the same time as creating the body regions 3. The rings may then be patterned (e.g. with a resist mask covering where the P type rings are required) prior to a source implant or deposition. This source implant or deposition would then dope the exposed polysilicon so as to become N type at the same time as creating the source regions 4.

An advantage of this process is that by selectively blocking out the source the channel stop 5 can be made N type rather than a floating N within a P type body region as in FIG. 1. A floating channel stop can cause difficulties during dynamic breakdown conditions. The ability to selectively pattern the source diffusion is also a requirement of many intelligent MOSFET production processes.

Alternatively, the polysilicon layer 11 may be doped P type in a separate stage after the polysilicon deposition but before polysilicon patterning to a concentration higher than any anticipated body dope. This additional step makes it possible to trim the device characteristics (e.g. the threshold voltage) by altering the body implant without affecting the Vz of the ESD protection diodes.

The thick insulating layer 12 which underlies the gate electrode 13 and outer portions of the conductive layer 11 may be omitted so that the polysilicon layer 11 is only insulated by a thin layer of oxide in the same fashion as the gates 7a.

The field plate structure as described could also be combined with other termination techniques such as SIPOS and floating rings. Although it has been particularly described with relation to an N-channel MOSFET, it should be appreciated that the invention is applicable to N- and P-channel gated devices. MOSFETs and IGBTs are the most common MOS gated devices, although several other types also exist.

Figure 4:
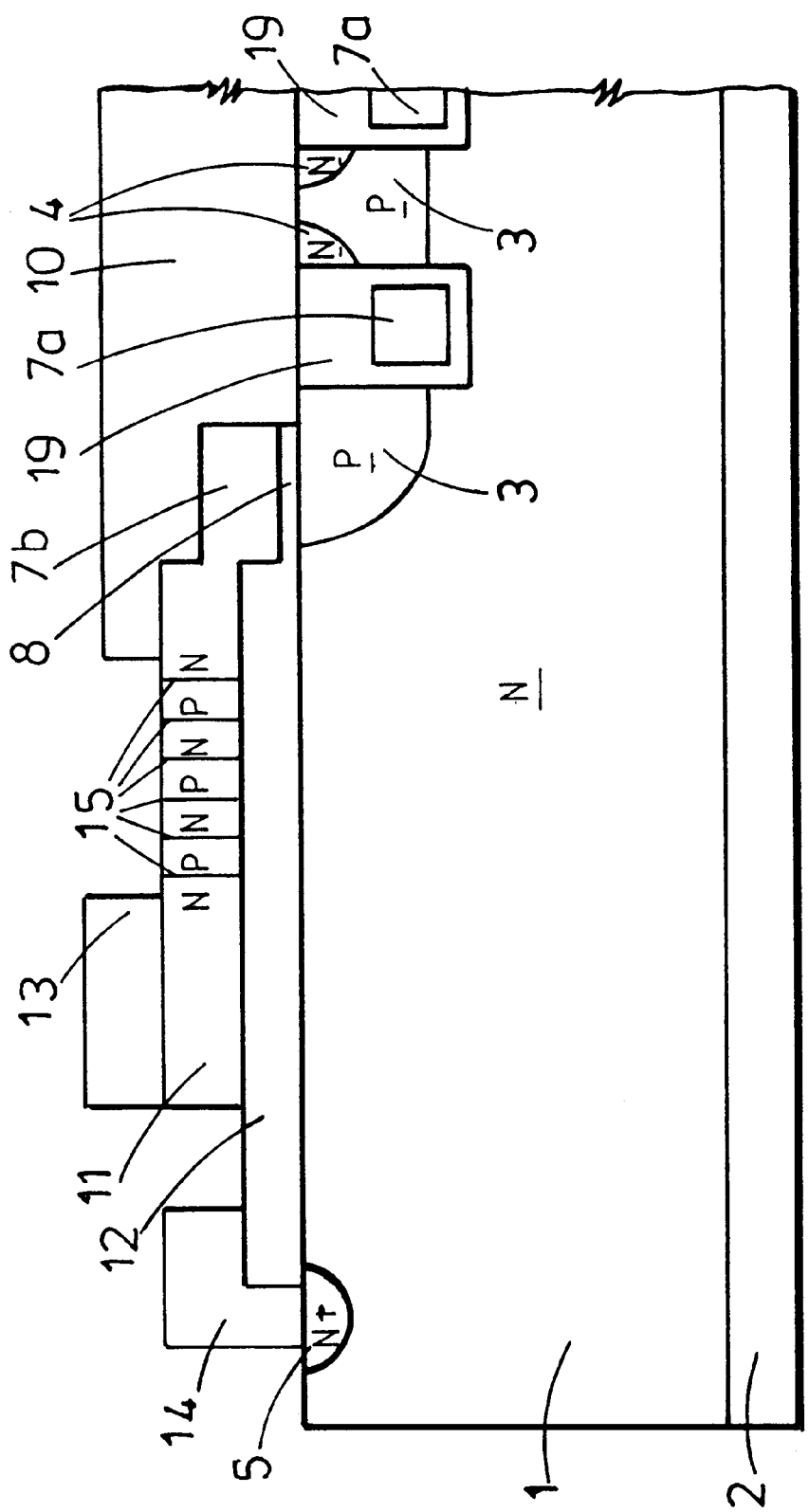
FIG. 4 is a view similar to that of FIG. 2 showing a trench MOSFET structure in accordance with the present invention.

Referring now to FIG. 4, this illustrates an embodiment of the invention which incorporates trench MOSFET structures rather than the planar MOSFET structures of FIGS. 2 and 3. The same reference numerals are used in FIG. 4 as in FIG. 2 where appropriate. The structure of FIG. 4 differs from that of FIG. 2 in that gate electrodes 7a are formed within trenches which penetrate tie body region 3 and ale located adjacent the source regions 4. The gates 7a are insulated from the surrounding structure by a body 19 of insulating material which fills the trench. It will be appreciated that the gate electrode 7a will be connected to the gate electrode field plate 13 by portions of a polysilicon layer 11 which extend beneath and are insulated from the source electrode 10. Thus gate current can flow between the gate electrode 13 and the gate 7a but the diode junctions 15 prevent gate current being shorted to the source electrode 10 unless the voltage between the two is sufficient to break down the diode junctions 15.

What is claimed is:

1. A gated semiconductor device comprising a substrate defining an active surface area including at least one source region, at least one gate formed adjacent to aid insulated from the at least one source region, a source electrode in electrical contact with the source region, and a termination extending around the periphery of the active surface area, the termination comprising a gate electrode and a layer of conductive material electrically connected between the gate electrode and the said at least one gate, wherein the layer of conductive material is in electrical contact with the source electrode and incorporates at least one N-P junction defining a semiconductor breakdown diode located so as to be connected in series between the gate electrode and the source electrode.

2. A device according to claim 1, wherein spaced apart portions of an outer edge of the source electrode electrically contact the conductive layer, openings are formed in the conductive layer spaced apart around the outer edge of the source electrode such that each said spaced apart portion of the source electrode edge is located between the openings of a respective pair of openings, and N-P junctions are formed in the conductive layer outside the outer edge of the source electrode such that each junction extends between and terminates at the openings of a respective one of the said pairs of openings.

3. A device according to claim 1, wherein the layer of conductive material and the said at least one gate are formed from a single layer of polysilicon.

4. A device according to claim 3, wherein the gate electrode is of metal and is supported by the polysilicon layer.

5. A device according to claim 1, wherein the layer of conductive material is connected to a plurality of gates distributed adjacent the periphery of the active surface area of the substrate.

6. A device according to claim 1, comprising a plurality of diodes arranged in series between the gate electrode and the source electrode, the diodes being formed by successive sections of N and P type conductive material.

7. A device according to claim 1, wherein the conductive layer is formed on an oxide layer which extends beneath the at least one gate.

8. A device according to claim 7, wherein the oxide layer beneath the conductive layer is thicker than the oxide layer beneath the gate.

* * * * *